(12) United States Patent
Maazouz et al.

(10) Patent No.: US 10,896,802 B2
(45) Date of Patent: Jan. 19, 2021

(54) COMBINED SEM-CL AND FIB-IOE MICROSCOPY

(71) Applicants: Mostafa Maazouz, Hillsboro, OR (US); Galen Gledhill, Hillsboro, OR (US); Garrett Budnik, Hillsboro, OR (US); Jorge Filevich, Portland, OR (US)

(72) Inventors: Mostafa Maazouz, Hillsboro, OR (US); Galen Gledhill, Hillsboro, OR (US); Garrett Budnik, Hillsboro, OR (US); Jorge Filevich, Portland, OR (US)

(73) Assignee: FEI Company, Hillsboro, OR (US)

( * ) Notice: Subject to any disclaimer, the term of this patent is extended or adjusted under 35 U.S.C. 154(b) by 98 days.

(21) Appl. No.: 16/231,039

(22) Filed: Dec. 21, 2018

(65) Prior Publication Data
US 2019/0198288 A1    Jun. 27, 2019

Related U.S. Application Data

(63) Continuation-in-part of application No. 16/229,936, filed on Dec. 21, 2018, now Pat. No. 10,692,694.
(Continued)

(51) Int. Cl.
*H01J 37/28* (2006.01)
*H01J 37/26* (2006.01)
(Continued)

(52) U.S. Cl.
CPC ............ *H01J 37/261* (2013.01); *H01J 37/21* (2013.01); *H01J 37/22* (2013.01); *H01J 37/28* (2013.01);
(Continued)

(58) Field of Classification Search
CPC .......... H01J 37/261; H01J 37/28; H01J 37/21; H01J 37/22; H01J 2237/31749; H01J 2237/2808; H01J 2237/2804; H01J 37/3056; H01J 37/226; H01J 2237/24507; H01J 2237/2445
(Continued)

(56) References Cited

U.S. PATENT DOCUMENTS 5,900,629 A    5/1999  Todokoro et al.
6,476,387 B1 * 11/2002 Nishimura .............. H01J 37/28
                                                   250/307
(Continued)

*Primary Examiner* — Michael Maskell
(74) *Attorney, Agent, or Firm* — Klarquist Sparkman, LLP

(57) ABSTRACT

Disclosed herein are example embodiments for performing microscopy using microscope systems that combine both scanning-electron-microscope-cathodoluminescence (SEM-CL) microscopy and focused-ion-beam ion-induced optical emission (FIB-IOE) microscopy. Certain embodiments comprise operating a microscopy system in a first microscopy mode in which an electron beam interacts with a sample at a sample location and causes first-mode photons and electrons to be emitted, the first-mode photons including photons generated through a cathodoluminescence process; and operating a microscopy system in a second microscopy mode in which an ion beam interacts with a sample at the sample location and causes second-mode photons to be emitted, the second-mode photons including photons generated through an ion-induced luminescence process and photons generated through an atomic de-excitation process.

23 Claims, 12 Drawing Sheets

Related U.S. Application Data

(60) Provisional application No. 62/610,886, filed on Dec. 27, 2017, provisional application No. 62/610,822, filed on Dec. 27, 2017.

(51) Int. Cl.
  *H01J 37/21* (2006.01)
  *H01J 37/22* (2006.01)

(52) U.S. Cl.
  CPC .............. *H01J 2237/2804* (2013.01); *H01J 2237/2808* (2013.01); *H01J 2237/31749* (2013.01)

(58) Field of Classification Search
  USPC ............................... 250/306, 307, 310, 311
  See application file for complete search history.

(56) References Cited

U.S. PATENT DOCUMENTS

| | | |
|---|---|---|
| 7,714,285 B2 | 5/2010 | Barnard |
| 8,809,779 B2 | 8/2014 | Xiao et al. |
| 8,981,292 B2 | 3/2015 | Khursheed et al. |
| 9,472,373 B1 | 10/2016 | Lanio et al. |
| 9,953,804 B2 | 4/2018 | Fichter et al. |
| 2002/0028399 A1 | 3/2002 | Nakasuji et al. |
| 2008/0185509 A1* | 8/2008 | Knowles ............... H01J 37/256 250/251 |
| 2011/0198497 A1* | 8/2011 | Biberger ............... H01J 37/222 250/307 |
| 2012/0025075 A1* | 2/2012 | Moore ................. G02B 21/367 250/307 |
| 2012/0112062 A1* | 5/2012 | Novak .................. H01J 37/244 250/307 |
| 2012/0193530 A1* | 8/2012 | Parker .................. H01J 37/228 250/307 |
| 2013/0140459 A1* | 6/2013 | Galloway ............... H01J 37/28 250/310 |
| 2014/0131573 A1* | 5/2014 | Parker .................. H01J 37/228 250/307 |
| 2019/0013178 A1* | 1/2019 | Zachreson ......... G02B 27/0916 |

* cited by examiner

COMBINED SEM-CL AND FIB-IOE MICROSCOPY

CROSS-REFERENCE TO RELATED APPLICATION

This application claims the benefit of U.S. Provisional Application No. 62/610,886 entitled "COMBINED SEM-CL AND FIB-IOE MICROSCOPY" and filed on Dec. 27, 2017; and U.S. Provisional Application No. 62/610,822 entitled "METHOD AND APPARATUS FOR ENHANCING SE DETECTION IN MIRROR-BASED LIGHT IMAGING CHARGED PARTICLE MICROSCOPES," and filed on Dec. 27, 2017, both of which are hereby incorporated by reference herein in their entirety.

This application is also a continuation-in-part of U.S. Nonprovisional application Ser. No. 16/229,936 entitled "METHOD AND APPARATUS FOR ENHANCING SE DETECTION IN MIRROR-BASED LIGHT IMAGING CHARGED PARTICLE MICROSCOPES" and filed on Dec. 21, 2018, which is also incorporated by reference herein in its entirety.

FIELD

This application relates to microscope systems that combine both scanning-electron-microscope-cathodoluminescence (SEM-CL) microscopy and focused-ion-beam ion-induced optical emission (FIB-IOE) microscopy.

BACKGROUND

Scanning-electron-micro scope-cathodoluminescence (SEM-CL) microscopy is a technique that provides information about the trace elements and mechanically induced defects in solids. SEM-CL can be used to provide fundamental insights into, among other things, crystal growth and deformation of solids. However, SEM-CL is limited by its spatial resolution and lack of elemental analysis capability. Thus, improved SEM-CL that overcome these shortcomings are desirable.

SUMMARY

Disclosed herein are representative embodiments of methods, apparatus, and systems for performing microscopy using both scanning-electron-microscope-cathodoluminescence (SEM-CL) microscopy and focused-ion-beam ion-induced optical emission (FIB-IOE) microscopy. The disclosed methods, apparatus, and systems should not be construed as limiting in any way. Instead, the present disclosure is directed toward all novel and/or nonobvious features and aspects of the various disclosed embodiments, alone or in various combinations and subcombinations with one another.

The disclosed examples include systems that comprise an ion beam source configured to generate and focus an ion beam at a sample location along an ion-beam axis, an electron beam source configured to generate and focus an electron beam at the sample location along an electron-beam axis, and a reflector positioned between the sample and the ion beam source and electron beam source. In these embodiments, the reflector is shaped to receive light emitted from a sample at the sample location resulting from an interaction between the sample and either the ion beam or the electron beam; the reflector is further shaped to reflect the light to a light detection system. In some implementations, the reflector comprises a parabolically shaped mirrored surface. In other implementations, the reflector comprises an elliptically shaped mirrored surface. In some implementations, the light detection system comprises a fiber optic cable having an input end and an output end optically coupled to a photodetector that is inside or outside of a vacuum system, and the elliptically shaped mirror surface is configured to focus the light emitted from the sample to the input end of the fiber optic cable. The system can further comprise a movement stage coupled to the reflector and configured to move the reflector relative to the sample location and relative to the electron beam axis and the ion beam axis. In some implementations, the reflector includes a first aperture positioned to allow passage of the electron beam into an interior of the reflector and a second aperture positioned to allow passage of the ion beam into the interior of the reflector. In some cases, the first aperture and the second aperture are slotted apertures. In further cases, the first aperture and the second aperture are combined into one slotted aperture. In further implementations, the reflector includes an aperture that is positioned to allow passage of the electron beam into an interior of the reflector in a first reflector position, and to allow passage of the ion beam into the interior of the reflector in a second reflector position. For instance, the reflector and the sample can be coupled to a controllable stage configured to move the reflector into the first reflector position and into the second reflector position. In some implementations, the system further comprises a steering electrode situated adjacent to the reflector so as to direct secondary charged particles emitted from the sample based on an interaction between the sample and either the ion beam or the electron beam. The reflector can be set to an appropriate voltage to help direct secondary electrons toward the detector. In such implementations, the system can further comprise a secondary charged particle detector situated to receive the secondary charged particles emitted from the sample and directed by the steering electrode. In some implementations, the system further comprises a light beam source configured to generate and focus a photon beam at the sample location along an photon-beam axis, and wherein the reflector is further positioned and configured to receive light emitted from a sample at the sample location resulting from an interaction between the sample and the photon beam, the reflector further being shaped to reflect the light to a light detection system. The light emitted from the sample can correspond to a Raman emission or Raman scattering.

Further disclosed embodiments concern methods for operating a combined SEM/FIB system. For instance, one example method comprises operating a microscopy system in a first microscopy mode in which an electron beam interacts with a sample at a sample location and causes first-mode photons and electrons to be emitted, the first-mode photons including photons generated through a cathodoluminescence process; and operating the microscopy system in a second microscopy mode in which an ion beam interacts with a sample at the sample location and causes second-mode photons to be emitted, the second-mode photons including photons generated through an ion-induced luminescence process and photons generated through an atomic de-excitation process. The order in which the microscopy modes are performed can be exchanged. Further, in certain cases, the modes might at least partially overlap. In certain implementations, the method can further comprise positioning a reflector adjacent to the sample location so that the electron beam passes through a first aperture of the reflector during the first microscopy mode and so that the ion beam passes through a second aperture of the reflector during the second microscopy mode. Further, the method can comprise selectively rotating or moving the reflector to alter an angle of incidence of the electron beam or ion beam on the sample. In some implementations, the reflector comprises one or more slotted apertures configured to allow for the angle of incidence of the electron beam or the ion beam to be altered. The method can also be performed in support of one or more techniques to analyze the sample. For instance, the method can further comprise (a) performing a two-dimensional elemental analysis of the sample by correlating a wavelength of the photons generated through the atomic de-excitation process with a spectral profile of an element; (b) performing a three-dimensional depth profiling of the sample based at least in part on the photons generated through the atomic de-excitation process; and/or (c) end-pointing of the sample based at least in part on the photons generated through the atomic de-excitation process. In certain implementations, the first microscopy mode and the second microscopy mode use a common reflector and a common detection system. In some implementations, the secondary charged particles are generated in both the first microscopy mode and the second microscopy mode, and the method further includes positioning a steering electrode adjacent to the reflector so as to direct secondary charged particles emitted from the sample. In certain further implementations, the method comprises operating a microscopy system in a third microscopy mode in which a photon beam interacts with a sample at a sample location and causes Raman photon emissions (e.g., Raman scattering).

Yet another example embodiment disclosed herein is a system, comprising an ion beam source configured to generate and focus an ion beam at a sample location along an ion-beam axis, an electron beam source configured to generate and focus an electron beam at the sample location along an electron-beam axis, and a shared photon detection system configured through coincident point geometry to detect photons generated by interaction of the sample with the ion beam and by interaction of the sample with the electron beam.

The foregoing and other objects, features, and advantages of the invention will become more apparent from the following detailed description, which proceeds with reference to the accompanying figures.

DETAILED DESCRIPTION

I. General Considerations

Figure 1:
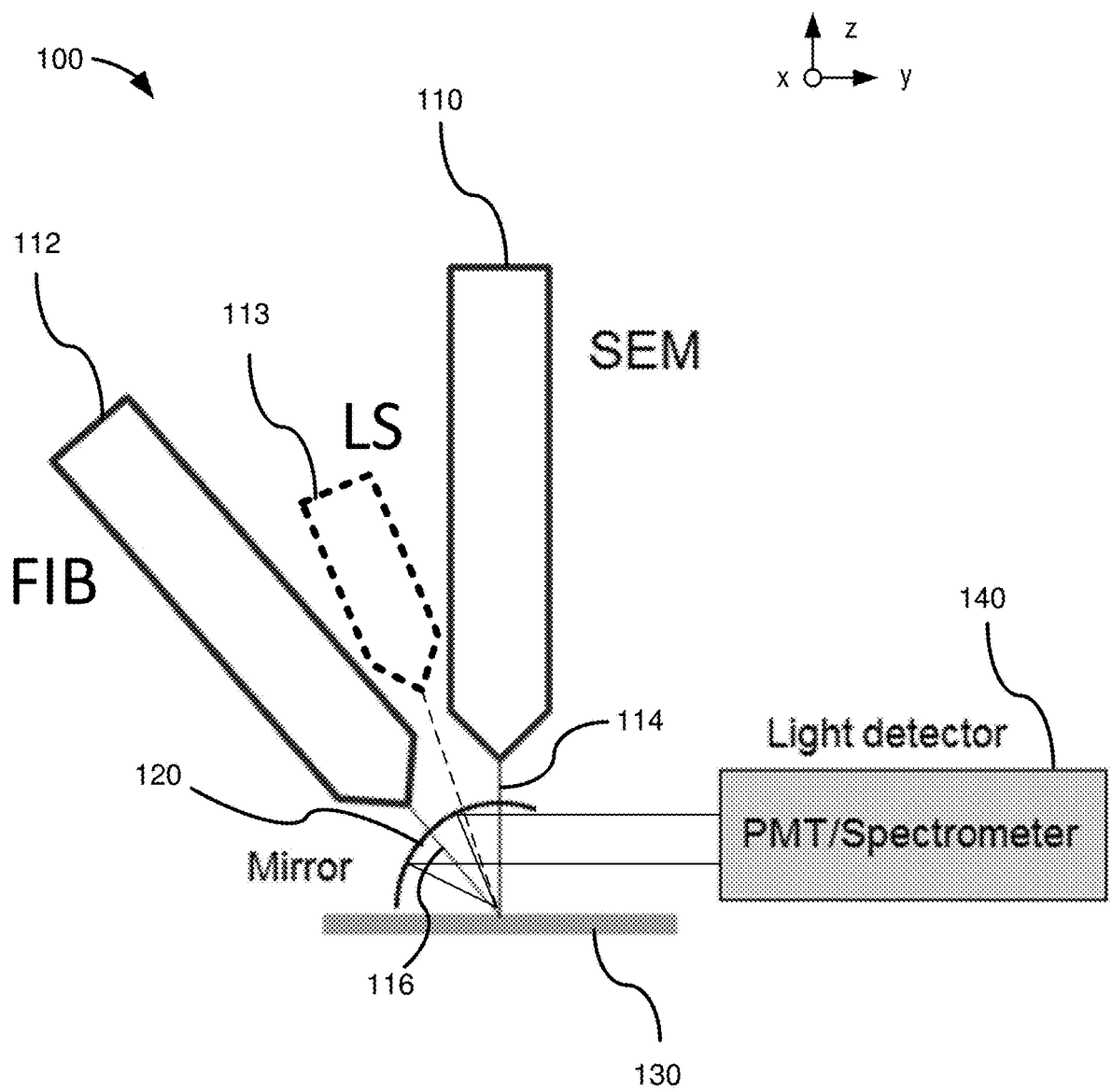
FIG. 1 is a schematic block diagram illustrating an embodiment of a combined SEM-CL and FIB-IOE system.

Disclosed herein are representative embodiments of methods, apparatus, and systems for performing microscopy using both scanning-electron-microscope-cathodoluminescence (SEM-CL) microscopy and focused-ion-beam ion-induced optical emission (FIB-IOE) microscopy. The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any feature or aspect of the disclosed embodiments can be used in various combinations and subcombinations with one another. For example, one or more method acts or features from one embodiment can be used with one or more method acts or features from another embodiment and vice versa. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "determine" and "provide" to describe the disclosed tools and techniques. These terms are high-level abstractions of the actual operations that are performed. The actual operations that correspond to these terms may vary depending on the particular implementation and are readily discernible by one of skilled in the art. Additionally, as used herein, the term "and/or" means any one item or combination of any items in the phrase.

As used herein, "charged particle" beams generally refers to beams containing positively or negatively charged particles, such as electrons, protons, and ions. Charged particle beam ions can include positively or negatively charged ions of Gallium, Oxygen, Cesium, noble gases, as well as other ion species can be used. Charged particle mass and charged particle velocity can be associated with an increase in spatial resolution.

Interactions between samples and charged particle beams (e.g., electron beams or ion beams) are typically defined by an interaction volume and produce various particle emissions from the sample, including particles emitted from a surface of the sample, from a sub-surface of the sample, or from particles or ejected material in proximity to the sample. Particle emissions can include back-scattered particles such as back-scattered electrons, protons, or ions, that typically retain a substantial portion of the energy of the particles of the incident charged particle beam (e.g., based on elastic or inelastic collisions).

Particle emissions from the sample can also include secondary electrons and secondary ions that correspond to emissions from sample atoms that have been excited by the incident charged particle beam. Secondary electron energies and secondary ion energies can vary substantially based on the energy of the incident charged particle beam as well as the specific materials of the sample and corresponding ionization energies. Representative secondary particle energies include from a few eV to several hundreds of eV in some examples, though tens of eV are more typical, and higher energy particles can decay into additional lower energy secondary particles.

Particle emissions from the sample can also include photons (e.g., "light," or "light particles") at various energies typically ranging from infrared to x-ray. Some emitted light particles correspond to cathodoluminescence or ion-based luminescence produced by the interaction between the charged particle beam and the sample, including secondary electrons or secondary ions ejected from the sample at different depths. Still further, some light particles correspond to excited atoms being ejected after excitation from an ion beam and de-exciting by emitting a photon with a wavelength indicative of the atom's elemental identity. Other examples include photon emission from a photon-sample interaction, and emitted particles can correspond to emitted photons, such as Raman emission.

Beams are typically described in relation to beam propagation axes and are generally shown at normal incidence with samples. It will be appreciated that a variety of incidence angles can be provided ranging from grazing incidence to normal incidence. Typically, a beam axis includes one or more straight line segments along which a light or charged particle beam propagates or along which one or more optical elements are situated. Such axes can be bent, folded, or varied with reflective surfaces or charged particle directing components, so that axes need not be single straight line segments. Apparatus are described that can include one or more lenses, reflectors, deflectors, etc., that can be electrostatically or magnetostatically configured to alter or focus charged particle trajectories. Samples that receive charged particle beams or light beams can include semiconductor targets, metal targets, or other targets. Detected secondary electrons, secondary ions, and light particles can be used to form images of samples, including sample shapes, layers, depths, and profiles, and to determine the presence (or absence) of different elements and structures, such as through spectral analysis of detected signals.

II. Overview of Disclosed Technology

The disclosed technology generally concerns microscopy systems that combine SEM-CL with FIB-IOE (and which may also include a further light source for detecting Raman scattering), resulting in a single microscope system that is capable of an extensive analysis of a sample. Because these techniques involve detecting and analyzing the light emitted from the sample, certain embodiments of the disclosed technology share the same light detection chain from the sample to the detection unit (e.g., a spectrometer) including the light collecting reflector (also referred to as a "mirror")). In coincident beam geometry, and in some embodiments, the mirror can rotate with the sample around the eucentric height providing, for example, 90-degree operation for the electron and ion beams. In some embodiments, the reflector has two (or more) apertures or slotted apertures enabling switching between SEM and FIB (and in some cases Raman scattering analysis) without interference. Further, for some embodiments, if angular-resolved measurements are not needed, an elliptical mirror can be used where light is collected by one or more fiber optic cables having input ends positioned at a focal point created by the reflector. In addition to coincident geometry operation, the reflector can also be operated in non-coincident beam geometry to avoid mechanical interferences with the SEM/FIB nose cone.

The combination of an SEM-CL system with an FIB-IOE system (including embodiments that share a common reflector/mirror and detection path) can greatly improve the spatial resolution from photons originating from within the sample while enabling 2D/3D elemental analysis of the sample being analyzed using the FIB-IOE.

III. Detailed Description of Embodiments of the Disclosed Technology

In this section, example embodiments for performing microscopy using both scanning-electron-microscope-cathodoluminescence (SEM-CL) microscopy and focused-ion-beam ion-induced optical emission (FIB-IOE) microscopy are disclosed.

FIG. 1 is a schematic block diagram illustrating a basic example system 100 of a combined SEM-CL and FIB-IOE system. The system 100 includes an electron source 110 (labelled "SEM") as well as a separate ion source 112 (labeled "FIB"). In some embodiments, an additional light source 113 (labeled "LS") can be included in the system and be configured to emit light beams (e.g., for SEM Raman imaging).

A wide variety of suitable electron and ion sources (with varying performance characteristics, components, lenses, and the like) can be used in embodiments of the disclosed technology and need not be described in detail here. For instance, the ion source can be configured to generate and form beams of positively or negatively charged ions of Gallium, Oxygen, Cesium, noble gases, as well as other ion species. For example, and without limitation, any of the ion sources or electron sources available from Thermo Fisher Scientific Corporation can be used.

Also shown in FIG. 1 is a sample 130 (e.g., a device under test, such as a semiconductor device (for instance, a silicon wafer for fabricating an ASIC or FPGA) or other material (for instance, any material whose structure or composition are of interest). As seen, the electron source 110 and ion source 112 are both positioned to produce a respective electron beam 114 and ion beam 116 that are incident on the sample 130 at a particular target location. As will be more fully explained below, some embodiments of the disclosed technology include a sample platform that can be repositioned (e.g., through translation and/or rotation) to achieve the desired beam interaction and targeting with the sample.

The system 100 further includes a mirror 120 that at least partially surrounds the sample 130. In general, the mirror 120 can be a structure that includes a mirrored surface on its interior surface. The mirrored surface can be parabolic, elliptical, or other suitable shape. (For purposes of this disclosure, the term "elliptical" also refers to "ellipsoidal", and the term "parabolic" also refers to "paraboloidal".) In general, the mirror 120 is configured to reflect photons emanating from the sample 130 during electron beam or ion beam scanning toward a detection unit 140. Further, in the combined system 100, both the SEM-CL and FIB-IOE imaging techniques can share the same light detection chain from the sample to the detection unit 140, including the light collecting mirror 120. Further, the mirror 120 can be adapted for the dual beam system shown in FIG. 1. For instance, as illustrated in FIGS. 6A-6D, the mirror 120 can include a first and a second aperture (or a first and a second slotted aperture) to enable switching between SEM and FIB scanning without interferences. Additional apertures or slotted apertures may also be present when additional beam sources are incorporated into the system (e.g., light source 113). Alternatively, the mirror 120 can include a single aperture or a single slotted aperture and be mounted on a movable (e.g., rotatable) platform that allows for switching between SEM and FIB scanning.

The detection unit 140 illustrated in FIG. 1 is typically a light detector (as shown) and can comprise any suitable detection unit. In the illustrated embodiment, the detection unit 140 is a combined PMT/spectrometer, but the detection unit can include other detection components (e.g., any one or more of a photodiode, APD, PMT, CCD, and/or CMOS sensor). The use of a single detection unit and single reflector greatly reduces resource usage, analysis time, space requirements, and cost.

Although focused ion beam approaches typically rely on charged particles for performing microscopy, focused ion beams also induce optical emissions that can be collected and detected in the same optical chain as SEM-CL using, for example, embodiments of the mirror 120 and the detection unit 140. Thus, the combined system 100 is counterintuitive insofar as it shares optical components with an SEM-CL system where non-optical components would normally be expected.

Figure 2:
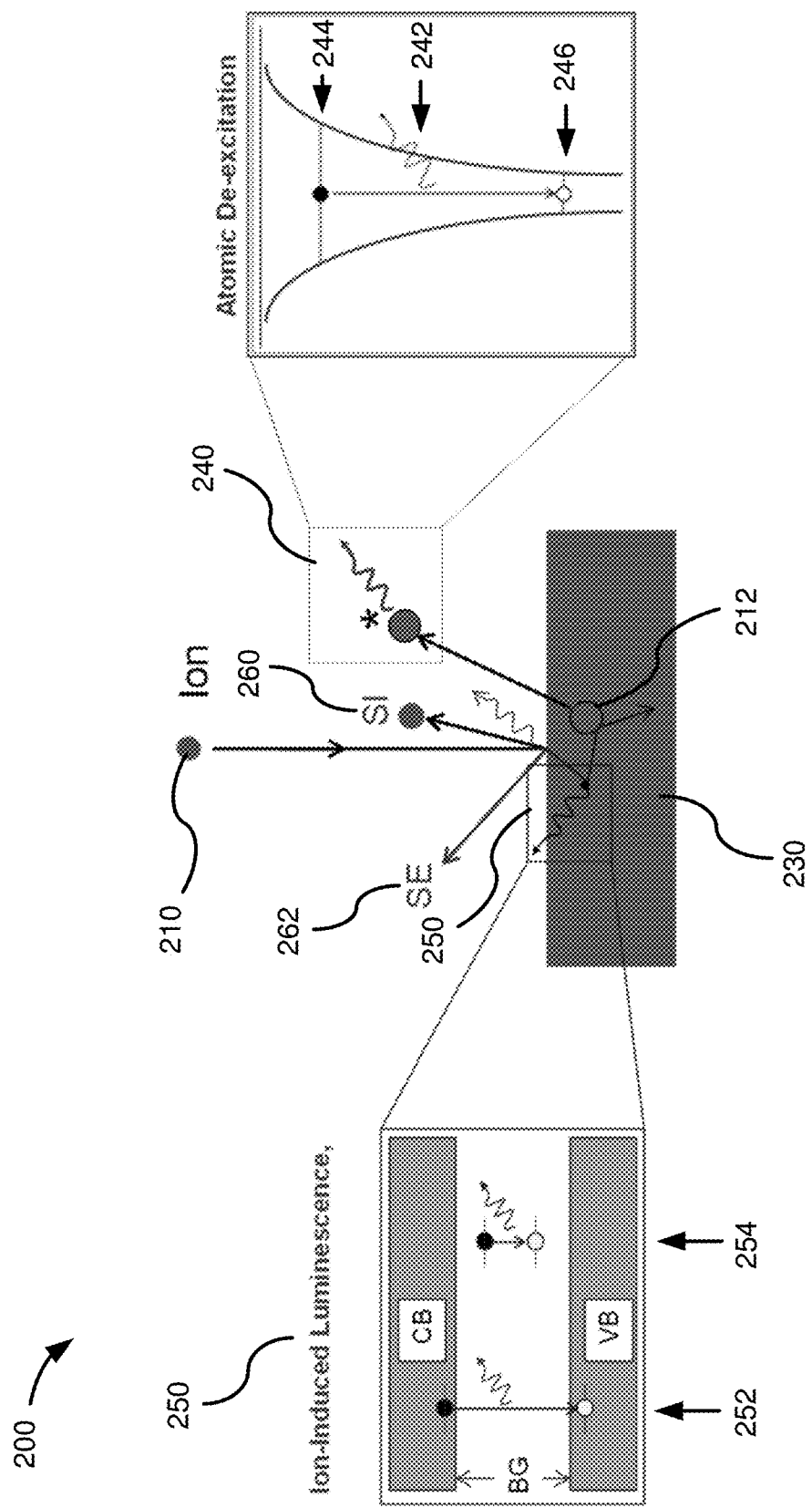
FIG. 2 is a schematic block diagram illustrating the optical emission processes that underlie focused ion beam (FIB) microscopy as is used in embodiments of the disclosed technology.

FIG. 2 is a schematic block diagram 200 illustrating the optical emission processes that underlie the focused ion beam (FIB) microscopy aspect of the disclosed technology. In particular, FIG. 2 shows an example incident ion 210 that is part of an ion beam directed toward a target location of a sample 230. As a result of the incident ion 210 (and depending on the structure and/or composition of the sample), a plurality of interaction processes resulting in photon emissions can be triggered.

The right side of FIG. 2 shows a first photon-producing process 240 from the incident ion 210. In this first interaction, the incident ion 210 interacts with the sample 230 and excites and ejects an atom 212 from the target material. The excited atom 212 then de-excites (as schematically shown at 240) and generates a photon emission 242 as it de-excites from an excited state 244 to a de-excited state 246. This de-excitation process can provide specific spectral information, such as very sharp spectral characteristics, from which one can infer which type of atom produced the photon emission 242, thereby providing elemental information. When such atomic de-excitations are triggered during two-dimensional ion-beam scanning (or three-dimensional scanning involving repetitive two-dimensional scanning where the z-axis (or depth) of the sample is examined during one or more subsequent two-dimensional scans), 2d or 3d elemental mapping of the sample can be performed. Additional applications include endpointing and depth profiling. For instance, for a sample with multiple layers, the ion beam can be used to perform ion milling to remove one layer, but to stop when the next layer is reached. The elemental information provided by the atomic de-excitation process illustrated at 240 can be used to determine when the next layer is revealed. For example, the wavelength (or wavelengths) produced by this atomic de-excitation process will change when a new layer is revealed. Further, ion milling combined with elemental analysis can be continued through to develop a three-dimensional depth profile across multiple layers (e.g., all layers).

The left side of FIG. 2 shows a second photon-producing process 250 that is similar to cathodoluminescence and can be triggered when the sample 230 includes bandgaps where electron holes exist that are revealed by the incident ion 210. For example, the collision of the incident ion 210 can excite those electrons, which will then subsequently de-excite. As part of the de-excitation process, one or more photons will be emitted, including photons that correspond to de-excitations that are greater than the band gap between a conduction band and a valence band (an example of which is shown at 252) and including photons that correspond to de-excitations that are less than the band gap between a conduction band and a valence band (an example of which is shown at 254).

FIG. 2 also shows interactions that may occur at the surface of the sample 230. For instance, the incident ion 210 can also cause a secondary ion 260 or a secondary electron 262 to be backscattered from the sample 230. In particular embodiments of the disclosed technology, the secondary ion 260 and secondary electron 262 can be detected with a charged particle detector. In further embodiments, the secondary ion 260 and secondary electron 262 can be detected by using an antenna to guide the charged particles out of the surrounding mirror (e.g., the mirror 120) before being received by a charged particle detector.

Figure 3:
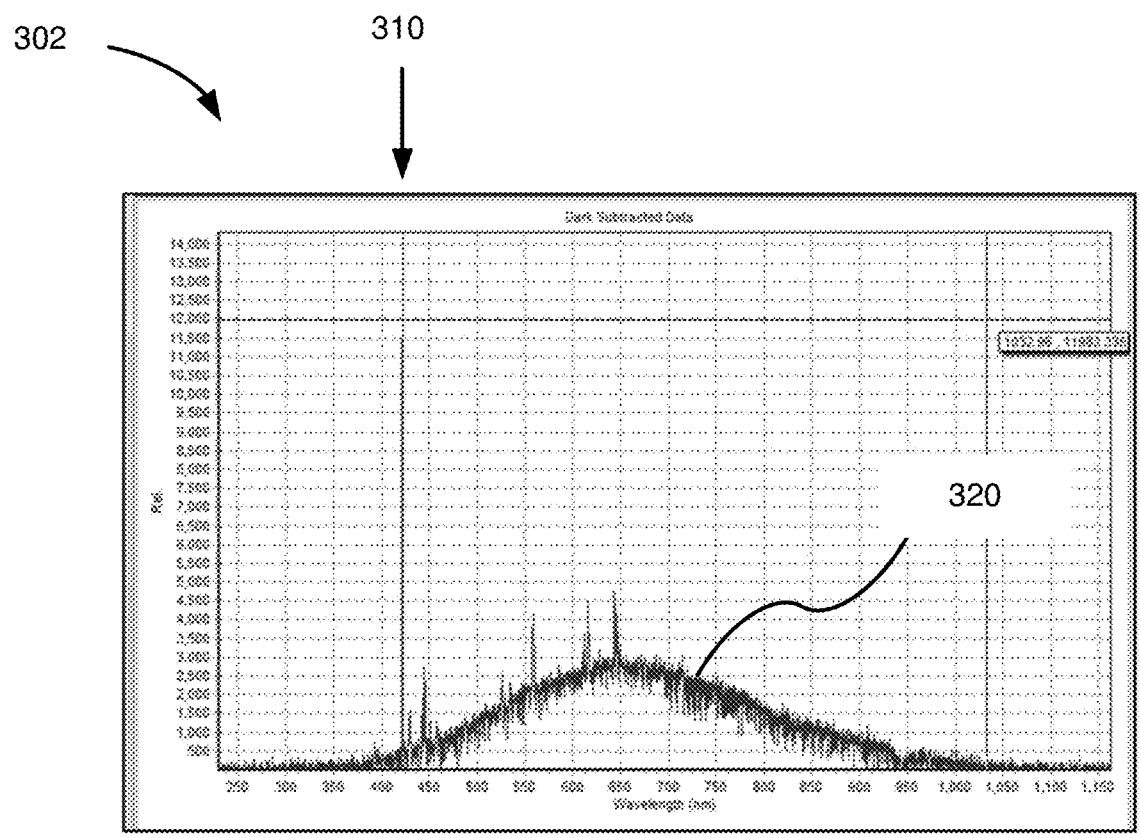
FIG. 3 is a graph showing results from detecting the two different photon-generating processes of FIG. 2 for an example sample.

FIG. 3 is a graph 300 showing results from detecting the two different photon-generating processes of FIG. 2 for an example sample across a range of wavelengths. As can be seen, the graph 300 in FIG. 3 includes a strong spectral line 310 as well as broad band data 320. The sharp spectral line 310 can be used to perform elemental analysis and identify the elemental identity at the target point of the sample. For instance, the Atomic Spectra Database maintained by the National Institute of Standards and Technology can be used to correlate the observed wavelength(s) to a particular element, thereby providing the elemental identity from the observed spectral lines (such as spectral line 310).

The sharp spectral lines (such as spectral line 310) are generated from the atomic de-excitation process whereas the broad band data 320 is obtained through ion-induced luminescence. Notably, both types of data are produced from a singular stimulus—an ion beam (such as ion beam 116). In other words, a single stimulus type (an ion beam) triggers two separate photon-generation processes that provide unique information that can be used in downstream analysis processes (e.g., structural analyses and imaging).

Figure 4:
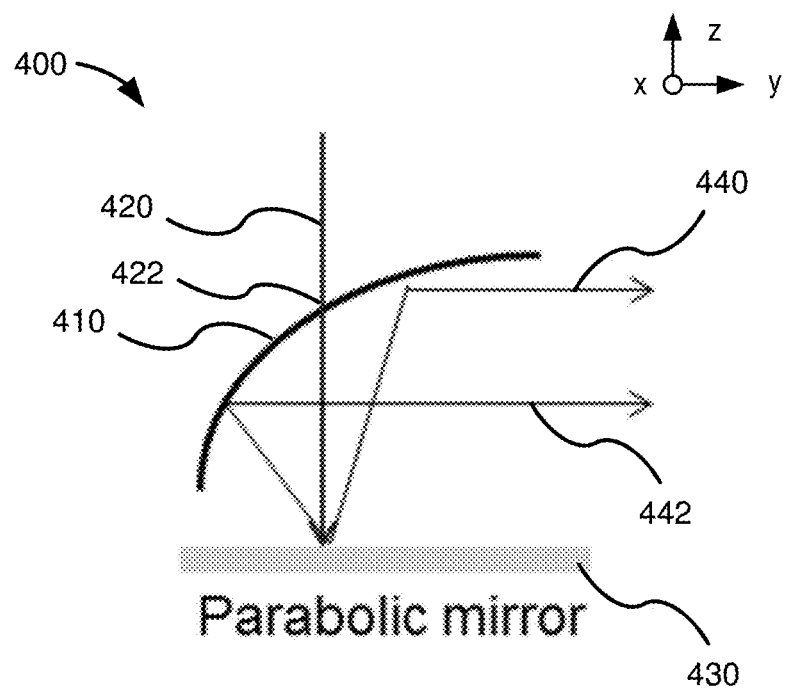
FIG. 4 is a schematic side view of a combined SEM-CL FIB-IOE system with a parabolic mirror.
Figure 5:
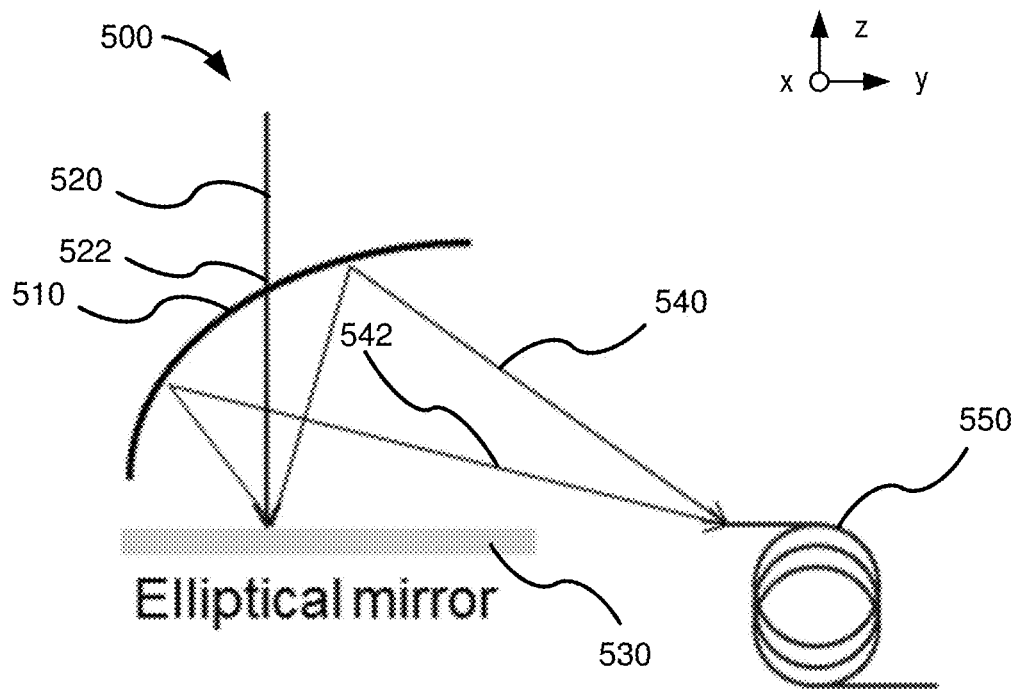
FIG. 5 is a schematic side view of a combined SEM-CL FIB-IOE system with an elliptical mirror.

As noted, example systems of the disclosed technology (e.g., system 100) can include a mirror that at least partially surrounds the sample. In general, the mirror is a structure that includes an interior surface that is reflective/mirrored and configured to direct incident photons in a desired direction. FIGS. 4 and 5 show two example mirror configurations 400, 500, respectively.

In particular, FIG. 4 is a schematic side view of a configuration 400 with a parabolic mirror 410. FIG. 4 also shows an incoming ion beam 420 that passes through an aperture 422 of the parabolic mirror and is incident on a target point of a sample 430. Also illustrated in FIG. 4 are two example photon paths 440, 442 resulting from the interaction of the ion beam 420 with the sample 430. The photon paths 440, 442 illustrate how the parabolic shape of the mirror 410 causes the photons to exit the mirror in a collimated (or substantially collimated) fashion.

FIG. 5 is a schematic side view of a configuration 500 with an elliptical mirror 510. FIG. 5 also shows an incoming ion beam 520 that passes through an aperture 522 and is incident on a target point of a sample 530. Also illustrated in FIG. 5 are two example photon paths 540, 542 resulting from the interaction of the ion beam 520 with the sample 530. The photon paths 540, 542 illustrate how the elliptical shape of the mirror 510 causes the photons to be focused by the mirror 510, thus allowing the photons to be directed into a first end of a fiber optic cable 550. A second end of the fiber optic cable 550 can be optically coupled to a detection unit (such as a PMT and/or camera (CCD)). The combination of the elliptical mirror 510 and the fiber optic cable 550 allow flexibility in the location of the detection unit.

FIGS. 6A-6D are schematic block diagrams showing top views of the mirror 120 and illustrate a nonlimiting variety of aperture configurations that can be used in embodiments of the disclosed technology.

Figures 6A, 6B:
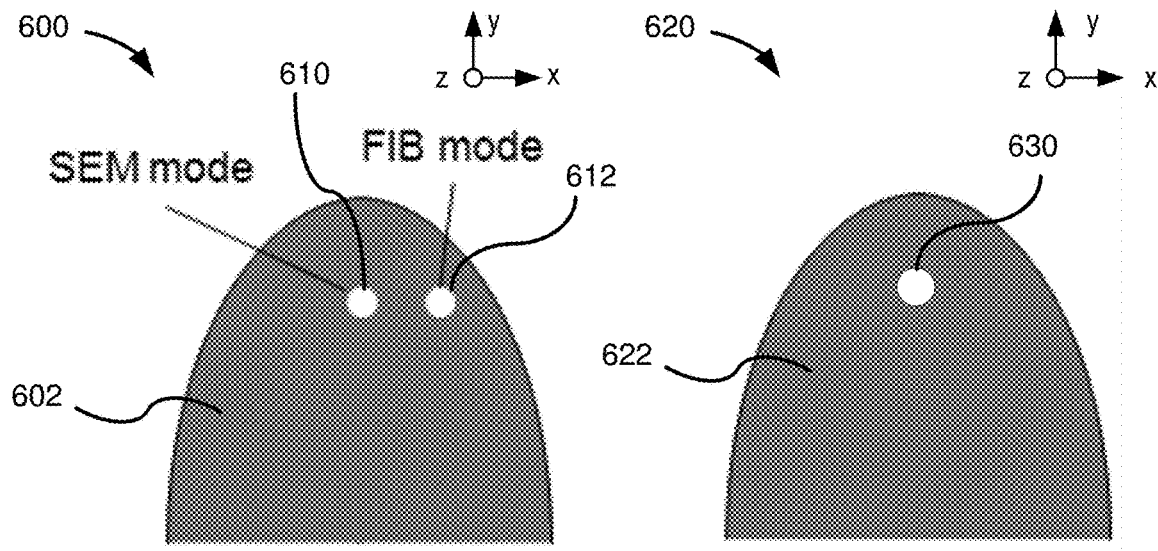
FIGS. 6(A)-6(D) are schematic block diagrams showing top views of example mirrors with different aperture configurations that can be used in embodiments of the disclosed technology.

FIG. 6A is a schematic top view 600 of a mirror 602 having a double aperture configuration in which a first aperture 610 is configured to input an electron beam (for SEM-CL) and a second aperture 612 is configured to input an ion beam (for FIB-IOE). It should be understood that the particular diameters/sizes, locations and relative distances between the apertures 610, 612 are not to be construed as limiting as they can be altered depending on the configuration. Further, the apertures 610, 612 can be swapped with one another. Further embodiments can include one or more additional apertures configured to input one or more additional beams (e.g., from a light source, such as light source 113).

FIG. 6B is a schematic top view 620 of a mirror 622 with a single aperture 630. In this embodiment, the mirror and sample are mounted on a maneuverable platform that allows the mirror and sample to be reconfigured (e.g., rotated, translated, or otherwise repositioned) to receive either an electron beam from an electron beam source or an ion beam from an ion beam source.

Figures 6C, 6D:
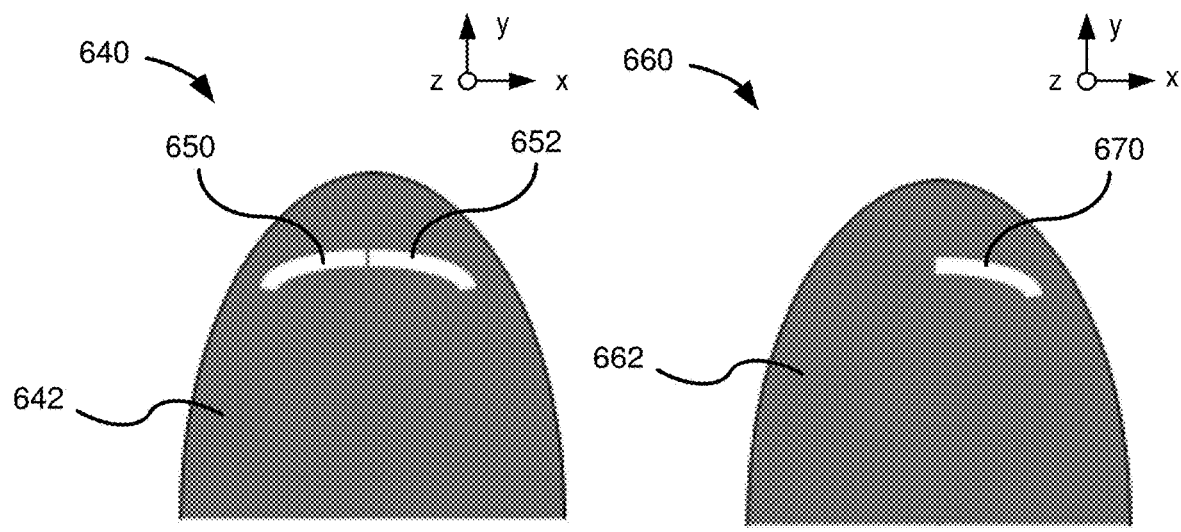

FIG. 6C is a schematic top view 640 of a mirror 642 having a double aperture configuration in which a first slotted aperture 650 is configured to input an electron beam (for SEM-CL) and a second slotted aperture 652 is configured to input an ion beam (for FIB-IOE). It should be understood that the particular locations and relative distances between the apertures 650, 652 are not to be construed as limiting as they can be altered depending on the configuration. Further, the apertures 650, 652 can be swapped with one another. The slotted aspect of the apertures 650, 652 allows the incident beams to be more easily targeted to different locations and with different angles of the sample without moving the sample and taking fuller advantage of the shape of the mirror so as to improve the flux of photons being reflected by the mirror to the detection unit. For instance, the mirror and sample can be mounted on a maneuverable platform that allows the mirror and sample to be reconfigured (e.g., rotated, translated, or otherwise repositioned) to receive either an electron beam from an electron beam source or an ion beam from an ion beam source across a range of angles. For example, with the disclosed embodiment, the mirror 642 can rotate with the sample around the eccentric high providing, for instance, 90-degree operation for the electron and ion beams. In additional embodiments, larger or smaller rotations than 90 degrees can be provided, such as 60 degrees, 45 degrees, 135 degrees, etc. Further embodiments can include one or more additional slotted apertures configured to input one or more additional beams (e.g., from a light source, such as light source 113)

FIG. 6D is a schematic top view 660 of a mirror 662 with a single slotted aperture 670. In this embodiment, the mirror is mounted on a maneuverable platform that allows the mirror and sample to be reconfigured (e.g., rotated, translated, or otherwise repositioned) to receive either an electron beam from an electron beam source or an ion beam from an ion beam source (and, in some embodiments, a photon beam from a light source). The slotted aspect of the aperture 670 allows the incident beams to be more easily targeted to different locations of the sample without moving the sample and taking fuller advantage of the shape of the mirror so as to improve the flux of photons being reflected by the mirror to the detection unit.

FIGS. 7-10 show images collected from embodiments of the disclosed technology, including images obtained through a SEM-CL process and images obtained through a FIB-IOE process. The images highlight the differences and advantages that can be realized through a combined SEM-CL/FIB-IOE system.

Figure 7:
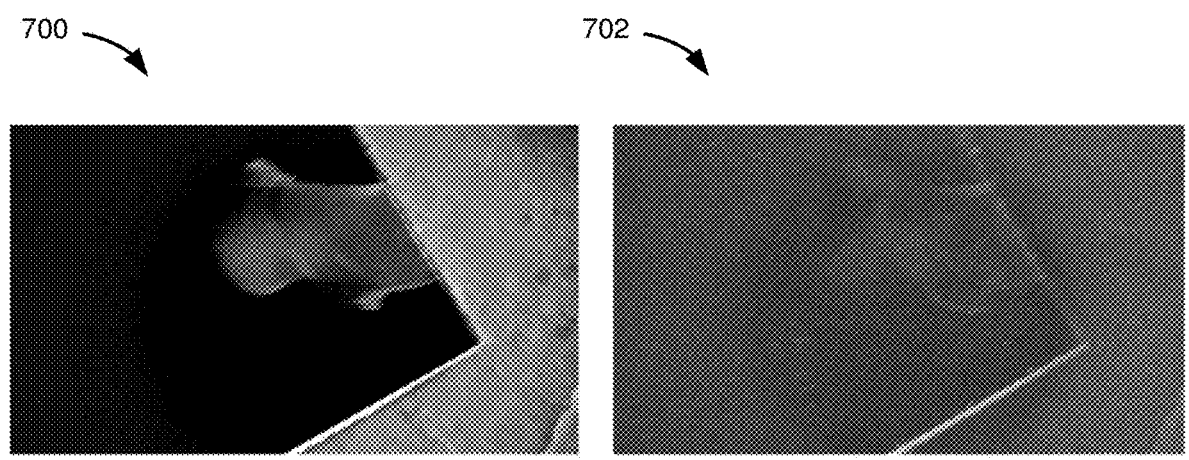
FIGS. 7-10 show images collected from embodiments of the disclosed technology, including images obtained through a SEM-CL process and images obtained through a FIB-IOE process.

FIG. 7 shows a FIB-SE image 700 of a $SiO_2$ sample and a FIB-IOE image 702 of the same $SiO_2$ sample. The FIB-IOE image 702 reveals particulate details that are not apparent from the SEM-FIB-SE image 700. Further, and as explained above, the detected light can be used to perform elemental analysis.

Figure 8:
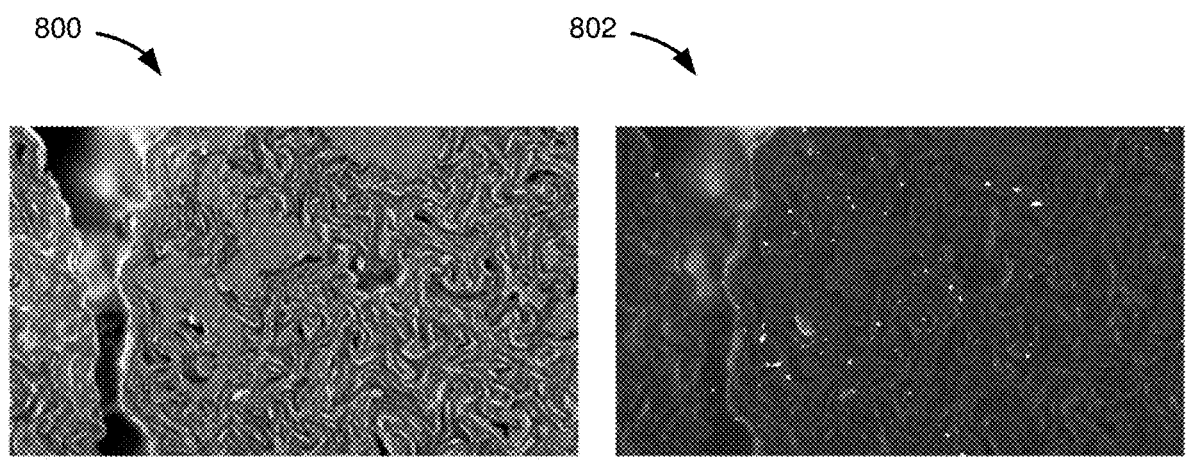

FIG. 8 shows a FIB-SE image 800 of a pencil lead sample and a FIB-IOE image 802 of the same sample. The FIB-IOE image 802 reveals particulates that are not apparent from the FIB-SE image 800. Further, and as explained above, the detected light can be used to perform elemental analysis.

Figure 9:
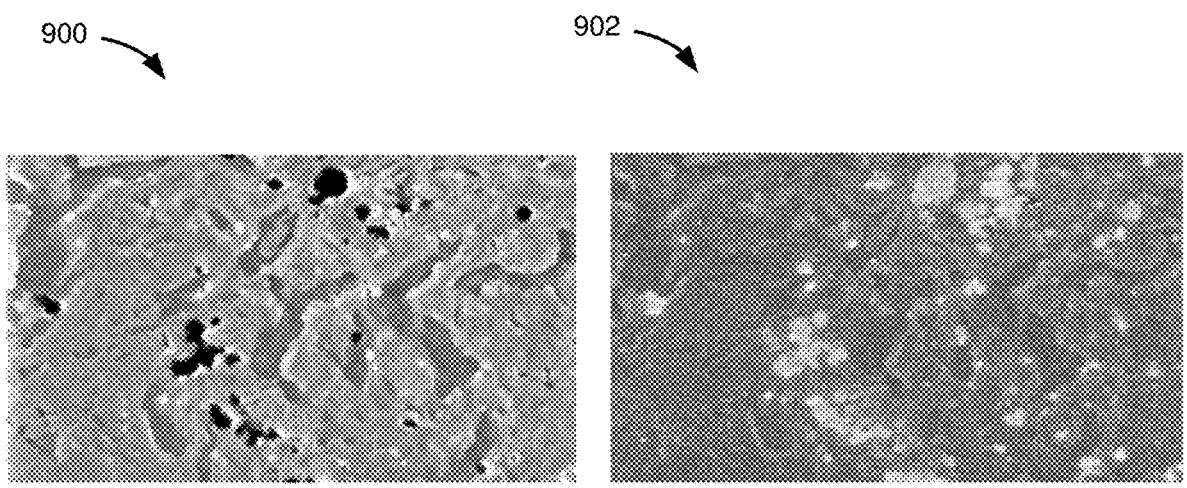

FIG. 9 shows a FIB-SE image 900 of a diamond sample and a FIB-IOE image 902 of the same sample. The FIB-IOE image 902 shows an inverted contrast image showing similar aspects of the FIB-SE image 900. Further, and as explained above, the detected light can be used to perform elemental analysis.

Figure 10:
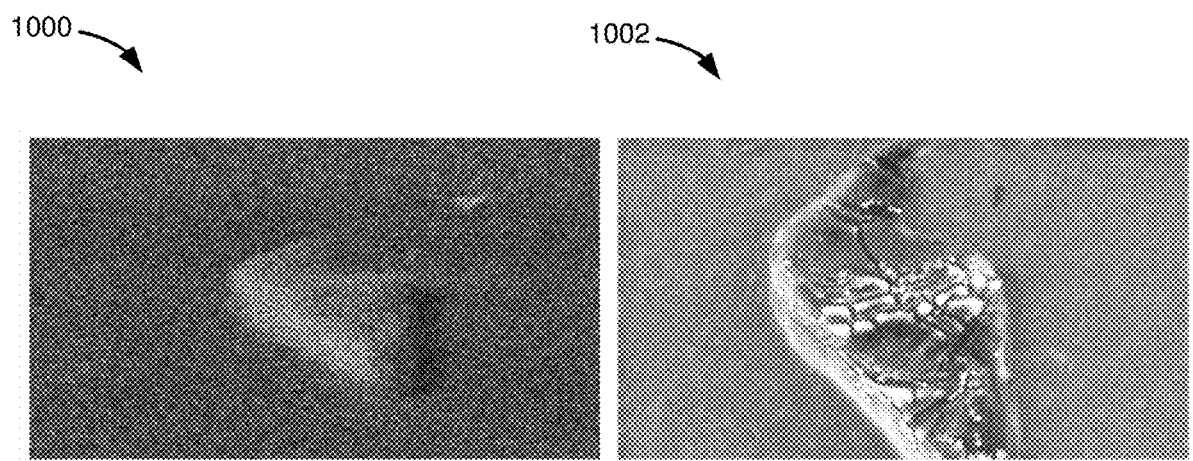

FIG. 10 shows a SEM-CL image 1000 of a diamond sample and a FIB-IOE image 1002 of the same diamond sample. The FIB-IOE image 1002 reveals details structural edges that are superior to the SEM-CL image 1000. Further, and as explained above, the detected light can be used to perform elemental analysis.

Figure 11:
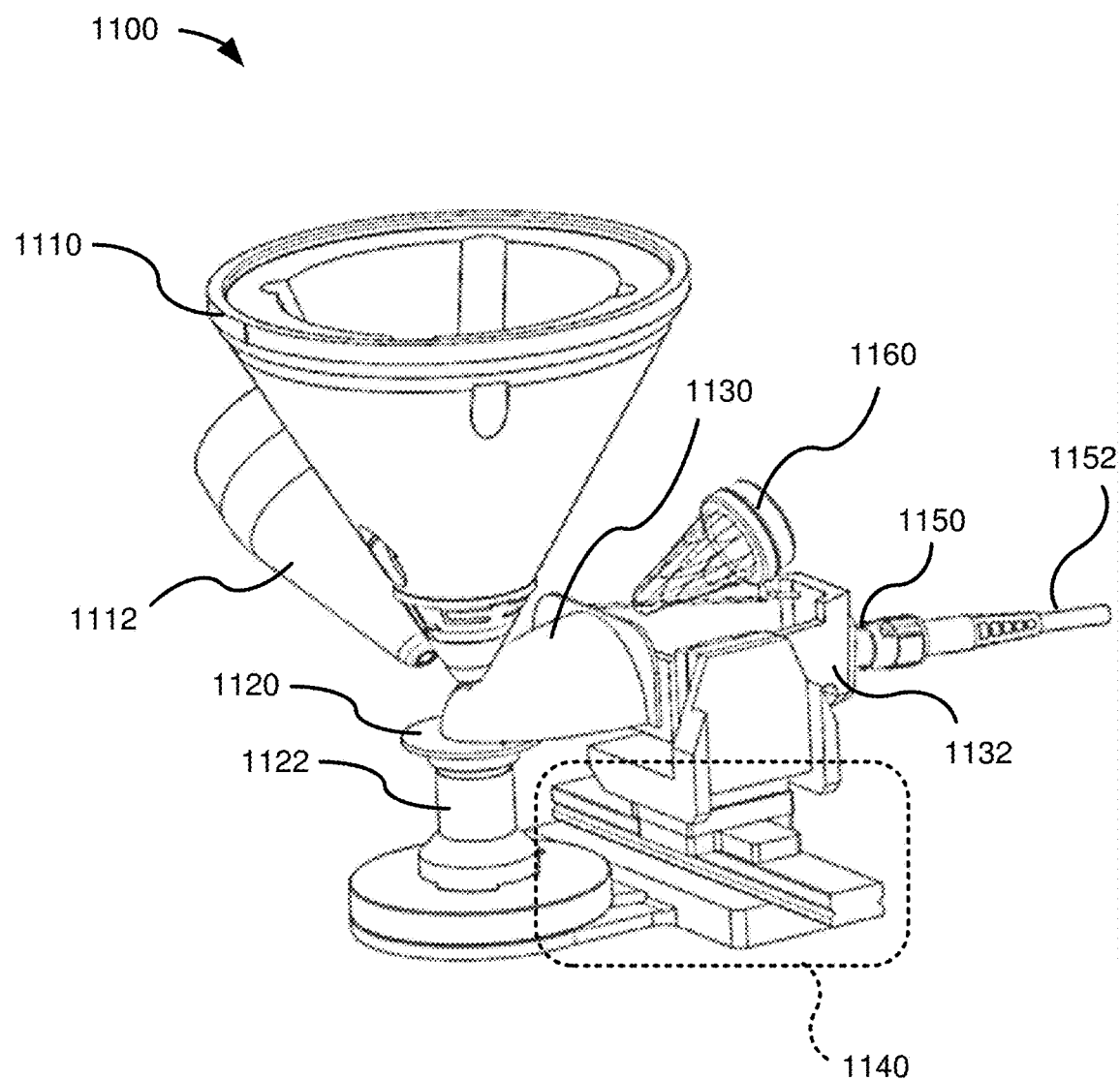
FIG. 11 shows a further example implementation of a combined SEM-CL FIB-IOE system.

FIG. 11 is a perspective view of an example implementation 1100 of a combined SEM-CL and FIB-IOE system. The example implementation 1100 shown in FIG. 11 includes several components that are shown in a cut-away or shown only partially in order to better illustrate the concepts of the disclosed technology. Further, the configuration 1100 shown in FIG. 11 is by way of example only, and is not to be construed as limiting in any way.

FIG. 11 shows two beam sources: an electron beam source 1110 (where only the nose cone of the electron beam source 1110 is shown) and an ion beam source 1112 (where only nose of the ion beam source 1112 is shown). It should be understood, however, that the two charged particle sources can be swapped in certain embodiments. Still further, it should be understood that one or more beam sources can also be present (e.g., a light source). The example configuration 1100 also shows a sample 1120 placed on a sample support platform 1122. Also shown in configuration 1100 is a reflector (mirror) 1130 where the mirrored surfaced (e.g., a parabolic mirror, elliptical mirror, or other mirror) is in the interior of the reflector/mirror 1130 and directs photons resulting from the incident electron beam/ion beam toward a detection unit. In the illustrated embodiment, the reflector 1130 is an elliptical mirror configured to reflect the photons to an optical connector 1150, which is coupled to an optical fiber 1152. The optical fiber 1152 is further coupled to a detection unit (not shown). Also shown in FIG. 11 is a particle detector 1160, which is situated to detect charged particles (e.g., steered by a steering electrode) Example embodiments of the disclosed technology including a particular detector and a steering electrode are described in more detail below with respect to FIG. 12.

In the illustrated embodiment, the reflector 1130 is mounted on a mobile stage 1132 that is translatable into a first sample-measurement position in which the reflector is moved to at least partially surround the sample and allows an incoming electron or ion beam (or additional beam, such as a light) to produce mirrored photons for detection by a detection unit, or a second non-measurement position (not shown, in which the mirror structure is moved away from the sample, thus allowing the sample 1120 to be replaced or otherwise moved into a different measurement position).

In some embodiments, the sample support platform 1122 and the sample 1120 are movable (along any (or any combination of) the x-, y-, and z-axis), thus allowing the sample to be moved into any desirable measurement location with respect to either the electron beam source 1110 or the ion beam source 1112. For instance, in FIG. 11, a translation platform, a portion of which is shown generally at 1140, allows for this type of movement. The translation platform can be formed from multiple uni-directionally-translatable subplatforms (not all of which are shown in FIG. 11).

Still further, in some embodiments, the sample 1120 and sample support platform 1122 can be moved independent of the reflector 1130 but also can be moved with the reflector 1130. For instance, the sample 1120, sample support platform 1122, and reflector 1130 can be further mounted on a rotatable (or otherwise movable) platform, thus allowing, for example, the incidence angle of the incoming ion beam or electron beam to be altered.

Figure 12:
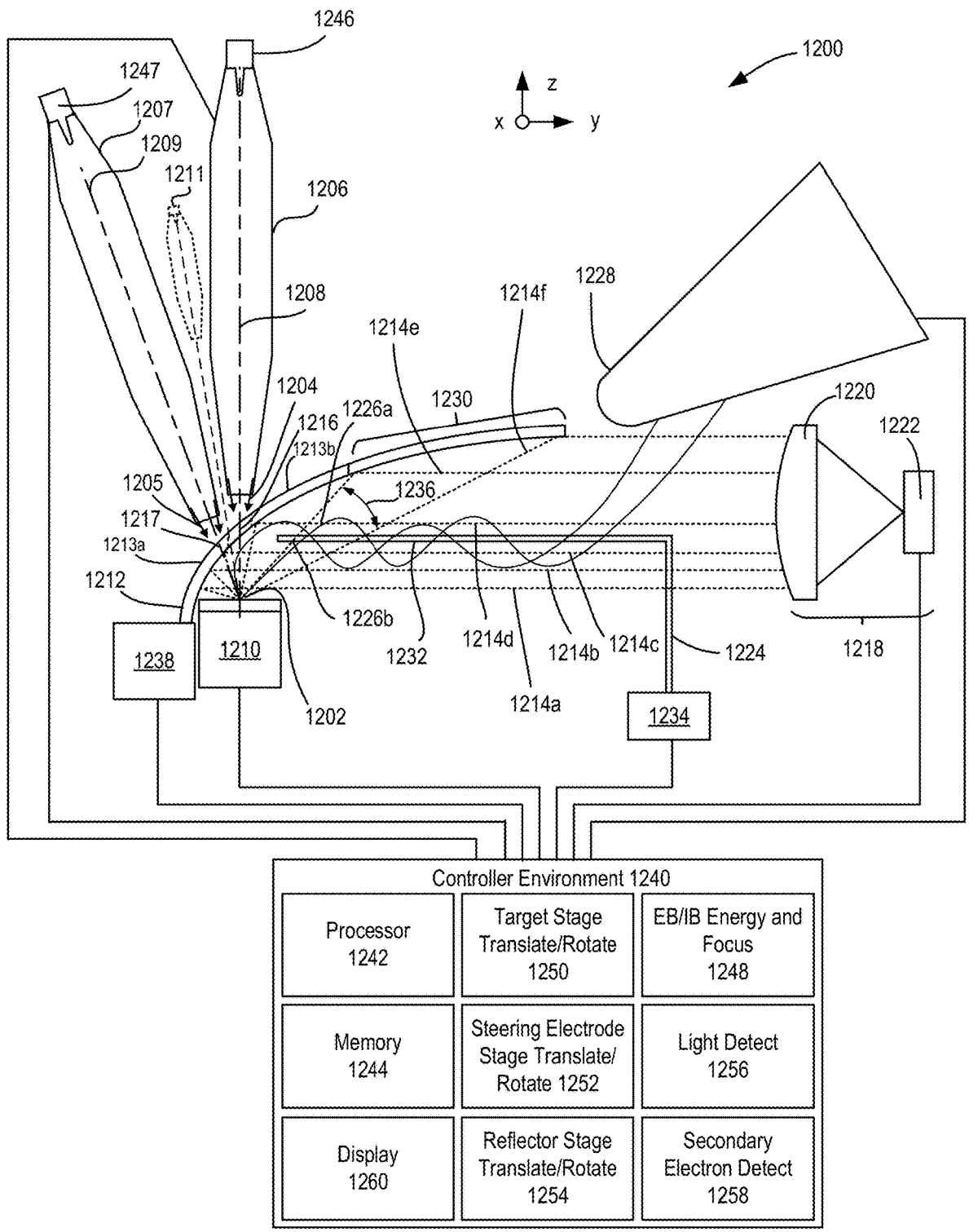
FIG. 12 shows another example implementation of a combined SEM-CL FIB-IOE system that includes a steering mechanism for secondary charged particles produced during either SEM-CL or FIB-IOE.

FIG. 12 shows another example embodiment of a system 1200 that includes an electron beam source and an ion beam source but further includes mechanisms that can be used to enhance secondary electron detection. In the illustrated example, the system 1200 is a dual-beam microscope with an electron beam and focused ion beam. The system 1200 is generally situated to support a charged particle target 1202, such as a sample to be analyzed by an electron microscope, focused ion beam system, Raman scattering system, etc. An electron beam 1204 is focused with a lens arrangement 1206 (typically comprising one or more electric or magnetic lens elements in a columnar arrangement) along an electron beam axis 1208 and directed to the target 1202. In typical examples, the lens arrangement 1206 can also provide scanning of the electron beam 1204 in one or more directions in relation to the target 1202. An ion beam 1205, is focused with a lens arrangement 1207 (typically comprising one or more electric or magnetic lens elements in a columnar arrangement) along an ion beam axis 1209 and directed to the target 1203. In typical examples, the lens arrangement 1207 can also provide scanning of the ion beam 1205 in one or more directions in relation to the target 1203. It should be noted that the ion beam 1205 is shown schematically in FIG. 12 and, in a real-world implementation, may be located in a different orientation and position (e.g., as shown in FIG. 11).

The target 1202 is typically supported by a sample movement stage 1210 that can be translated and/or rotated in various directions so that the target 1202 can be positioned at a suitable plane or position relative to the electron beam 1204 and/or the ion beam 1205, such as at a focus. In particular examples, the sample movement stage 1210 allows movement of the sample to a eucentric focus location of an electron beam and a differently-angled focused ion beam. The sample movement stage 1210 can then further allow rotation of the sample at the eucentric focus so that the sample can be in view of the electron beam or the focused ion beam. In different examples, the target 1202 can be grounded or biased, including with a variable bias such as with a device test signal.

Representative embodiments of the apparatus 1200 further include a reflector 1212 (shown in cross-section), typically in the form of a curved mirror, such as with a parabolic shape, positioned adjacent to the target 1202. The charged particles of the electron beam 1204 and/or ion beam 1205 interact with the target 1202 so as to produce various particle emissions at the target 1202, including emissions occurring in proximity to the focus location of the electron beam 1204 or ion beam 1205 as emitted particles relax to various lower energy states and emit additional particles. As explained above with respect to FIG. 2, some particle emissions can include light emission at various wavelengths, and the reflector 1212 is situated to receive a portion of the emitted light as light particles 1214a-1214f and to direct the light along a direction different from the ion electron beam axis 1208 or ion beam axis 1209. In typical examples, various angles of the emitted light particles 1214a-1214f are directed parallel to each other as a collimated beam, as shown in FIG. 12, though directing the light, or different angle ranges of the light, in one or more directions other than collimated is also possible. Various geometrical characteristics of the reflector 1212 can be adjusted to vary light direction, including symmetrically or asymmetrically, circular or elliptical paraboloids, aberration correction, etc. Some examples can include elliptical shapes such that reflected light is focused at one or more points or lines rather than collimated. Reflector shapes can be varied based on charged particle beam and sample interaction shape.

As explained above with respect to FIGS. 5, 6(a), and 6(b), the reflector 1212 can include one or more apertures 1216 situated so as to allow the electron beam 1204, ion beam 1205, and/or additional beams to pass through the reflector 1212 to the target 1202. An optical detection arrangement 1218, such as a spectrometer or other optical assembly, can be situated to receive and detect the light particles 1214a-1214f. In some examples, the optical detection arrangement 1218 can include an optical focusing element 1220 (e.g., one or more refractive and/or reflective components) that direct the received light particles 1214a-1214f to an optical detector 1222. Various optical arrangements can be used, including free-space and/or fiber-coupled, to detect monochromatic or multichromatic light. In some examples, optical detectors can include one or more of a photodiode, APD, PMT, CCD, and/or CMOS sensor. In representative embodiments, the emitted light particles 1214a-1214f correspond to cathodoluminescence emitted based on the interaction between the electron beam 1204 or ion-induced luminescence and photons resulting from atomic de-excitation based on the interaction between the ion beam 1205 and the target 1202.

In further examples, a light beam from a light source 1211 (which can be optionally included with the system) can be directed to the target along an optical axis, such as the charged particle beam axis 1208, ion beam axis 1209, or another axis provided with a separate optical column (as illustrated), and the emitted light particles 1214a-1214f are formed by an interaction between the sample and the light beam. Thus, in selected examples, imaging or probing of the target 1202 can also be performed by a light source, with associated photons also being collected with the reflector 1212. Suitable light sources can generate light beams with incandescent bulbs, light emitting diodes, laser diodes, fiber lasers, as well as other sources.

In representative examples, the system 1200 also includes a steering electrode 1224 adjacent to the reflector 1212 and that is biased to produce an electric field proximate the target 1202. As the target 1202 and the charged particle beam 1204 interact, various particles are produced with different energies and trajectories including x-rays, back-scattered electrons, and secondary electrons, such as secondary electrons 1226a, 1226b. The electric field produced by the steering electrode 1224 changes the paths of the secondary electron 1226a, 1226b to reduce a likelihood of contact with the reflective surface of the reflector 1212. In some examples, a particle detector 1228 is situated to receive the secondary electrons 1226a, 1226b steered by the steering electrode 1224. In particular examples, the position of the particle detector 1228 is such that absent the steering electrode, very few or none of the secondary electrons could be detected by the particle detector 1228. Representative particle detectors 1228 can include Everhart-Thornley detectors which typically include a Faraday cage that is biased to attract the secondary electrons 1226a, 1226b. The particle detector 1228 can be positioned above the reflector 1212 as shown, though other positions are possible, including below or to a side. In some examples, the reflector 1212 can be biased with a voltage so as to provide an electric field that directs secondary electrons, such as the secondary electrons 1226a, 1226b, away from the reflector 1212. The secondary electrons can then be further directed or extracted by the steering electrode 1224 and received and detected by the particle detector 1228. In particular examples, the reflector 1212 can be biased differently in different portions of the reflector 1212. For example, in a push electrode configuration, the reflector 1212 can have a portion 1213a left of the emission point of the target 1202 as depicted in FIG. 12 that can be biased higher than a portion 1213b that is to the right of the emission point. In some examples, the steering electrode 1224 can include one or more magnetic elements.

Representative examples of the steering electrode 1224 can include an antenna portion 1232 that can be made to extend longitudinally along a direction similar to the propagation of one or more of the light particles 1214a-1214f so that the antenna portion 1232 can be situated proximate the target 1202. A corresponding electric field that extends from the antenna portion 1232 with a voltage bias can cause the secondary electrons 1226a, 1226b to orbit the antenna portion 1232 before being received by the particle detector 1228. In some examples, a movement stage 1234 can be coupled to the steering electrode 1224 to translate and/or rotate the steering electrode 1224 so that the steering electrode 1224 can be inserted or positioned into a suitable location relative to the reflector 1212, target 1202, and particle detector 1228. The antenna portion 1232 can have various shapes, including linear, curved, segmented (e.g., with alternating insulating and conductive portions), bent, or a combination. In some examples, a longitudinal shape of the antenna portion 1232 can be aligned with an optical axis of the reflector 1212, and in other examples the longitudinal shape can be situated at an angle to an optical axis of the reflector 1212. The movement stage 1234 is configured to keep the steering electrode 1224 in a fixed position during emission of the charged particle beam 1204, though in some examples, the movement stage 1234 can move, vibrate, or scan the steering electrode 1224 during emission. In further embodiments, the voltage applied to the steering electrode 1224 can be varied with respect to time during emission, such as according to an oscillating or other time-dependent signal.

With the secondary electrons 1226a-1226b directed away from the reflector by the steering electrode 1224, the reflector 1212 can be configured in various way to improve performance. Usual approaches to compensate for poor secondary electron collection efficiencies, such as increasing charged particle beam current or increasing dwell time, can be mitigated with the described approaches herein. For example, improved collection efficiency can be achieved without increasing current, thereby avoiding a tradeoff in resolution, and increased dwell times can be avoided that could cause a reduction in signal fidelity or that could damage the target to be imaged (particularly with ions).

In some examples, the reflector 1212 includes an extended length 1230 that can be used to reflect additional angles of light particles, including the light particle 1214f and an angle range 1236 between the light particles 1214e, 1214f. The extended length 1230 can be selected in relation to the extent to which the secondary electrons 1226a, 1226b can be directed away from the extended length 1230 by the steering electrode 1224. In further examples, the extended length 1230 can be further extended based on the biasing of the reflector 1212. In some examples, the reflector 1212 is positioned more closely to the target 1202, as the directing of the secondary electrons 1226a, 1226b with the steering electrode 1224 away from the reflector 1212 can provide additional margin for collection. The closer positioning of the reflector 1212 allows the lens arrangement 106 to be moved along the charged particle beam axis 1208 closer to the target 102 without obstruction by the reflector 112, thereby allowing a shorter working distance and performance improvements such as finer spatial resolution.

In representative examples, the reflector 1212 can be coupled to a movement stage 1238 to precisely align the reflector 1212 with the target 1202, charged particle beam axis 1208, and corresponding light emitted by the sample. The movement stage 1238 can also be used to move the reflector 1212 as the target 1202 is moved, e.g., for processing by one or more other charged particle beams, or to completely remove the reflector 1212 from the area of the target 1202. While the movement stage 1238 as shown is coupled proximate a vertex end of the reflector 1212, the movement stage 1238 can be coupled to the reflector at other locations as well, such as an opposite end or to one or more other sides.

The apparatus 1200 can also be coupled to a controller environment 1240 that can be used to receive signals from and/or control various components. The controller environment 1240 can include one or more computing devices that include at least a processor 1242 and a memory 1244. Computing devices can include desktop or laptop computers, mobile devices, tablets, logic controllers, etc. The processor 1242 can include one or more CPUs, GPUs, ASICs, PLCs, FPGAs, PLDs, CPLDs, etc., that can perform various data processing or I/O functions associated with the controller environment 1240, such as control and/or data processing. The memory 1244 can be volatile or non-volatile (e.g., RAM, ROM, flash, hard drive, optical disk, etc.), fixed or removable, and is coupled to the processor 1242. The memory 1244 can provide storage capacity for one or more computer-readable media. One or more system buses can provide a communication path between various environment components. The controller environment 1240 can also be situated in a distributed form so that applications and tasks are performed by remote processing devices that are linked through a communications network. In a distributed computing environment, program modules and logic can be located in both local and remote memory storage devices. In some examples, components in the controller environment 1240 need not be linked with other components.

The controller environment 1240 can be coupled to the lens arrangement 1206, the electron beam source 1246, the lens arrangement 1207, the ion beam source 1247, the light source 1211, and include control logic 1248 to vary different characteristics of the electron beam, ion beam, and/or light beam, such as through variation of lens electrode and/or emission source voltages. The controller environment 1240 can also be coupled to the movement stages 1210, 1234, 1238 with movement stage controls 1250, 1252, 1254 to vary respective translations and/or rotations of the target 1202, steering electrode 1224, and reflector 1212. The controller environment 1240 can be further coupled to the optical detector 1222 with light detect I/O 1256 so as to receive an optical detection signal associated with the light particles 1214*a*-1214*f*. The controller environment 1240 can also be coupled to the particle detector 1228 with particle detector I/O 1258 so as to receive a particle detection signal associated with the secondary electrons 1226*a*, 1226*b* that are directed by the steering electrode 1224. In representative embodiments, the detections signals from the particle detector 1228 and the optical detector 1222 can be received simultaneously based on the interaction between the electron beam 1204/ion beam 1205/light beam (from light source 1211) and the target 1202. In further examples, a display 1260 can be situated to show detected signals, sample images, electrode voltages, stage parameters, etc.

Computer programs for aligning reflector, detector, and steering electrode components can be embodied as software or firmware instructions carried out by a digital computer. For instance, any of the disclosed techniques can be performed by a computer or other computing hardware that is part of a microscopy system. The microscopy system can be connected to or otherwise in communication with detectors 1218, 1228 and be programmed or configured to receive optical and charged particle detection signals and perform imaging or material analysis computations (e.g., any of the techniques disclosed or incorporated herein). The computer can be a computer system comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid state drives (e.g., Flash drives)). The one or more processors can execute computer-executable instructions stored on one or more of the tangible, non-transitory computer-readable media, and thereby perform any of the disclosed techniques. For instance, software for performing any of the disclosed embodiments can be stored on the one or more volatile, non-transitory computer-readable media as computer-executable instructions, which when executed by the one or more processors, cause the one or more processors to perform any of the disclosed techniques. The results of the computations can be stored (e.g., in a suitable data structure or lookup table) in the one or more tangible, non-transitory computer-readable storage media and/or can also be output to the user, for example, by displaying, on the display 1260, with a graphical user interface.

Additional embodiments and details concerning systems, methods, and apparatus that can be used to enhance secondary particle detection are described in U.S. Provisional Application No. 62/610,822 entitled "METHOD AND APPARATUS FOR ENHANCING SE DETECTION IN MIRROR-BASED LIGHT IMAGING CHARGED PARTICLE MICROSCOPES," and filed on Dec. 27, 2017, and U.S. Nonprovisional application Ser. No. 16/229,936 entitled "METHOD AND APPARATUS FOR ENHANCING SE DETECTION IN MIRROR-BASED LIGHT IMAGING CHARGED PARTICLE MICROSCOPES" and filed on Dec. 21, 2018, all of which are considered to be part of this application and are hereby incorporated by reference herein in their entirety.

Figure 13:
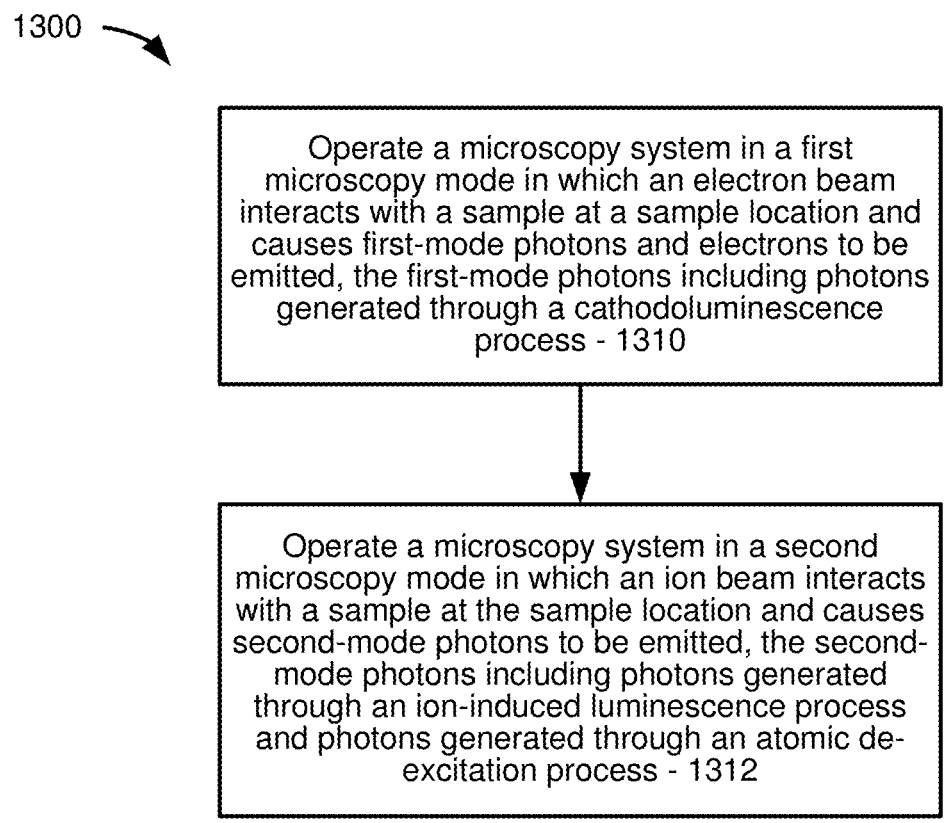
FIG. 13 is a flow chart of an example method for operating a microscopy system in accordance with the disclosed technology.

FIG. 13 is a flow chart showing an example method 1300 for performing microscopy using embodiments of the disclosed technology. The particular embodiment should not be construed as limiting, as the disclosed method acts can be performed alone, in different orders, or at least partially simultaneously with one another. Further, any of the disclosed methods or method acts can be performed with any other methods or method acts disclosed herein.

At 1310, a microscopy system is operated in a first microscopy mode in which an electron beam interacts with a sample at a sample location and causes first-mode photons and electrons to be emitted. In this embodiment, the first-mode photons include photons generated through a cathodoluminescence process.

At 1312, a microscopy system is operated in a second microscopy mode in which an ion beam interacts with a sample at the sample location and causes second-mode photons to be emitted. In this embodiment, the second-mode photons includes photons generated through an ion-induced luminescence process and photons generated through an atomic de-excitation process.

It should be understood that the illustrated order is not limiting, as the second microscopy mode can be performed before the first microscopy mode. Still further, in certain cases, the modes might at least partially overlap.

In certain embodiments, the method further comprises positioning a reflector adjacent to the sample location so that the electron beam passes through a first aperture of the reflector during the first microscopy mode and so that the ion beam passes through a second aperture of the reflector during the second microscopy mode. In further embodiments, the method further comprises positioning a reflector adjacent to the sample location so that the electron beam passes through an aperture of the reflector during the first microscopy mode and repositioning the reflector so that the ion beam passes through the aperture of the reflector during the second microscopy mode. In other embodiments, the method further comprises positioning a reflector adjacent to the sample location so that the electron beam passes through a slotted aperture during either the first microscopy mode or the second microscopy and selectively rotating or moving the reflector so as to target the sample at a different angle.

In cooperation with the method shown in FIG. 13, one or more analysis processes can be performed. For example, in certain embodiments, the method can further comprise performing an elemental analysis of the sample by correlating a wavelength of the photons generated through the de-excitation process with a spectral profile of an element. In some embodiments, the method can further comprise performing depth profiling, endpointing, or both of the sample based at least in part on the photons generated through the de-excitation process (as discussed above).

In further embodiments, the first microscopy mode and the second microscopy mode use a common reflector and a common detection unit. Still further, in some embodiments, secondary charged particles are generated in both the first microscopy mode and the second microscopy mode, and the method further includes positioning a steering electrode adjacent to the reflector so as to direct secondary charged particles emitted from the sample based on the charged particle beam (CPB)-sample interaction away from the reflector and CPB axis.

In further example embodiments, the method further comprises operating a microscopy system in a third microscopy mode in which a photon beam interacts with a sample at a sample location and causes Raman photon emissions.

IV. CONCLUDING REMARKS

Having illustrated and described the principles of the disclosed technology, it will be apparent to those skilled in the art that the disclosed embodiments can be modified in arrangement and detail without departing from such principles. For example, any one or more aspects of the disclosed technology can be applied in other embodiments. In view of the many possible embodiments to which the principles of the disclosed technologies can be applied, it should be recognized that the illustrated embodiments are only preferred examples of the technology and should not be taken as limiting the scope of the invention.

What is claimed is:

1. A system, comprising:
an ion beam source configured to generate an ion beam, the ion beam passes through a reflector before reaching a sample location; and
an electron beam source configured to generate an electron beam, the electron beam passes through the reflector before reaching the sample location, wherein
the reflector is positioned between the sample location and the ion beam source and electron beam source, the reflector further being shaped to receive light emitted from a sample at the sample location resulting from an interaction between the sample and either the ion beam or the electron beam, the reflector further being shaped to reflect the light to a light detection system.

2. The system of claim 1, wherein the reflector comprises a parabolically shaped mirrored surface.

3. The system of claim 1, wherein the reflector comprises an elliptically shaped mirrored surface.

4. The system of claim 3, wherein the light detection system comprises a fiber optic cable having an input end and an output end optically coupled to a photodetector that is inside or outside of a vacuum system, and wherein the elliptically shaped mirror surface is configured to focus the light emitted from the sample to the input end of the fiber optic cable.

5. The system of claim 1, further comprising a movement stage coupled to the reflector and configured to move the reflector relative to the sample location and relative to an electron beam axis and an ion beam axis.

6. The system of claim 1, wherein the reflector includes a first aperture positioned to allow passage of the electron beam into an interior of the reflector and a second aperture positioned to allow passage of the ion beam into the interior of the reflector.

7. The system of claim 6, wherein the first aperture and the second aperture are slotted apertures.

8. The system of claim 1, wherein the reflector includes an aperture that is positioned to allow passage of the electron beam into an interior of the reflector in a first reflector position, and to allow passage of the ion beam into the interior of the reflector in a second reflector position.

9. The system of claim 8, wherein the reflector and the sample are coupled to a controllable stage configured to move the reflector into the first reflector position and into the second reflector position.

10. The system of claim 1, further comprising:
a light beam source configured to generate and focus a photon beam at the sample location along a photon-beam axis, and wherein the reflector is further positioned and configured to receive light emitted from the sample resulting from an interaction between the sample and the photon beam.

11. The system of claim 10, wherein the light emitted from the sample corresponds to a Raman emission.

12. The system of claim 10, wherein the light emitted from the sample corresponds to Raman scattering.

13. A method, comprising:
operating a microscopy system in a first microscopy mode in which an electron beam interacts with a sample at a sample location and receives first-mode photons with a photon detection system, wherein the first-mode photons including photons generated through a cathodoluminescence process; and
operating the microscopy system in a second microscopy mode in which an ion beam interacts with the sample at the sample location and receives second-mode photons with the photon detection system, wherein the second-mode photons including photons generated through an ion-induced luminescence process and/or photons generated through an atomic de-excitation process.

14. The method of claim 13, further comprising positioning a reflector adjacent to the sample location so that the electron beam passes through a first aperture of the reflector during the first microscopy mode and so that the ion beam passes through a second aperture of the reflector during the second microscopy mode.

15. The method of claim 13, further comprising selectively rotating or moving a reflector to alter an angle of incidence of the electron beam or ion beam on the sample.

16. The method of claim 15, wherein the reflector comprises one or more slotted apertures configured to allow for the angle of incidence of the electron beam or the ion beam to be altered.

17. The method of claim 13, further comprising performing a two-dimensional elemental analysis of the sample by correlating a wavelength of the photons generated through the atomic de-excitation process with a spectral profile of an element.

18. The method of claim 13, further comprising performing three-dimensional depth profiling, endpointing, or both of the sample based at least in part on the photons generated through the atomic de-excitation process.

19. The method of claim 13, wherein the first microscopy mode and the second microscopy mode use a common reflector of the photon detection system.

20. The method of claim 13, wherein secondary charged particles are generated in both the first microscopy mode and the second microscopy mode, and wherein the method further includes positioning a steering electrode adjacent to a reflector so as to direct secondary charged particles emitted from the sample.

21. The method of claim 13, further comprising operating a microscopy system in a third microscopy mode in which a photon beam interacts with the sample and causes Raman emissions.

22. The method of claim 13, further comprising operating a microscopy system in a third microscopy mode in which a photon beam interacts with the sample and causes Raman scattering.

23. A system, comprising:
- an ion beam source configured to generate and focus an ion beam at a sample location along an ion-beam axis;
- an electron beam source configured to generate and focus an electron beam at the sample location along an electron-beam axis; and
- a shared photon detection system configured through coincident point geometry to detect photons generated by interaction of the sample with the ion beam and by interaction of the sample with the electron beam.

* * * * *